United States Patent [19]

Bickley et al.

[11] 3,886,379

[45] May 27, 1975

[54] RADIATION TRIGGERED DISCONNECT MEANS

[75] Inventors: Robert H. Bickley, Scottsdale; Philip L. Clar, Mesa, both of Ariz.

[73] Assignee: Motorola, Inc., Chicago, Ill.

[22] Filed: Dec. 13, 1972

[21] Appl. No.: 314,895

[52] U.S. Cl. .................. 307/202; 307/300; 307/253

[51] Int. Cl. .................. H03k 17/00

[58] Field of Search ........... 307/202, 300, 311, 253; 328/8; 317/9, 235 N, 235 AQ

[56] References Cited

UNITED STATES PATENTS 3,184,347 5/1965 Hoerni .................. 317/235 AQ 3,446,988 5/1969 Ogawa .................. 307/202

3,535,532 10/1970 Merryman .................. 317/235 N

*Primary Examiner*—Rudolph V. Rolinec
*Assistant Examiner*—B. P. Davis
*Attorney, Agent, or Firm*—Vincent J. Rauner; Michael D. Bingham; Victor Myer

[57] ABSTRACT

In conjunction with a circuit, such as an IC circuit or the like, which is sensitive to radiation, a high speed switching transistor normally biased in a saturation mode of operation connected between the circuit and a suitable power source with a semiconductor diode sensitive to the radiation connected to the transistor for providing a reverse bias to the transistor when radiation impinges upon the diode to cut off conduction of the transistor and prevent damaging currents to the circuit.

9 Claims, 2 Drawing Figures

RADIATION TRIGGERED DISCONNECT MEANS

BACKGROUND OF THE INVENTION

1. Field of the Invention

Many electronic circuits are utilized in environments wherein they may be subjected to relatively large doses of radiations, such as gamma rays or the like. Typical circuits of this type are circuits utilized in missiles, satellites, military weapons, etc. In general, semiconductor circuits, such as IC circuits, transistors, diodes and the like, react to radiation as though carriers are injected into the depletion layers to allow, possibly, destructive currents to flow therethrough.

2. Description of the Prior Art

In the prior art, photocurrents or radiation produced currents are prevented from reaching destructive proportions by shorting the voltage supply terminals or providing compensating circuits. Compensating circuits in general are circuits which are sensitive to the radiation and are connected to the primary circuit in such a way that the photocurrent from the compensating circuit provides the photocurrent requirement for the primary circuit and the photocurrent from the primary circuit need not flow through the load. This allegedly protects the load from the photocurrent, however, the primary circuit and the compensating circuit are unprotected so that damaging photocurrents can develop therein. Other circuits for protecting against damaging photocurrents due to radiation include diverters providing an alternate path for the photocurrents. In general, all of these prior art circuits allow the photocurrents to develop and simply provide alternate paths to protect the output circuits. Thus, the photocurrents can reach damaging proportions in the primary and diverting circuits.

SUMMARY OF THE INVENTION

The present invention pertains to radiation triggered disconnect means wherein a circuit to be protected is connected to a suitable power source through a series connected transistor which is normally biased in a saturation mode of operation and has coupled thereto semiconductor junction means which provide a current in response to radiation striking said junction means, which current is utilized to reverse bias the transistor to cut off conduction and prevent damaging photocurrents from the radiation in the protected circuit.

It is an object of the present invention to provide an improved radiation triggered disconnect means to radiation harden integrated circuits and the like.

It is a further object of the present invention to provide a transistor connected in series with the power supply connection of the circuit to be protected, which transistor is normally operating in the saturation mode and which is cut off to remove power from the circuit upon radiation striking the circuit.

It is a further object of the present invention to provide a transistor connected in series with any terminal of the circuit which would normally be connected to an external circuit but should be disconnected for its own protection during the presence of ionizing radiation.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
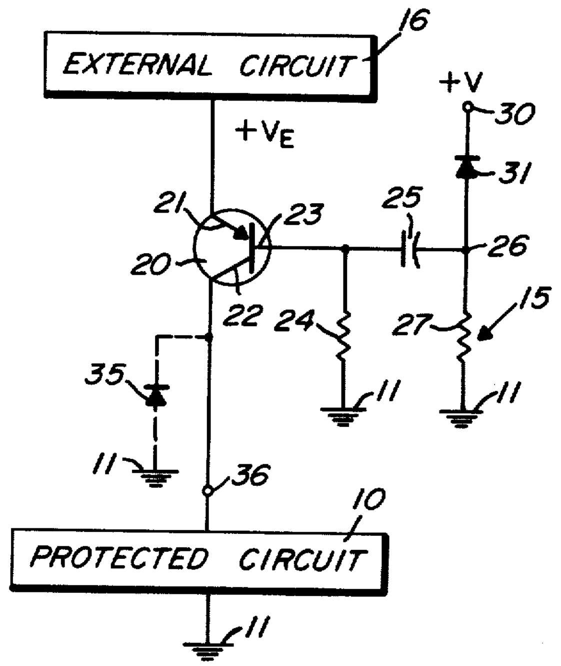
FIG. 1 is a schematic diagram of an embodiment of a radiation triggered disconnect means.

Referring specifically to FIG. 1, a circuit to be protected from ionizing radiation, such as gamma rays and the like, is illustrated in block form and designated 10. One side of the protected circuit 10 is connected to a common point 11, such as ground or the like. The opposite side of the protected circuit 10 is connected through a radiation triggered disconnect means, generally designated 15, to a suitable source of power, which is illustrated in block form labelled "External Circuit" and designated 16. The protected circuit 10 may be any circuit including integrated circuits, transistors, semiconductor diodes, etc., which are susceptible to damage from photocurrents induced by radiation and, in particular, gamma rays. The external circuit 16 may be a power supply or other external circuitry from which the protected circuit 10 should be disconnected during the presence of radiation.

In the illustrated embodiment of the disconnect means 15, a PNP type transistor 20 is utilized. The transistor 20 has an emitter 21 connected directly to a positive source of voltage in the external circuit 16 and a collector 22 connected directly to the protected circuit 10 so that current flowing from the external circuit 16 to the protected circuit 10 must flow through the emitter to collector circuit of the transistor 20. A base electrode 23 of the transistor 20 is connected to the common 11 through a resistance, which in the present embodiment is illustrated as a single resistor 24. The value of the resistor 24 is chosen to bias the transistor 20 into a saturation mode of operation to provide a minimum amount of resistance to the flow of current from the external circuit 16 to the protected circuit 10.

The base 23 of the transistor 20 is further connected through a coupling capacitor 25 to a junction 26. The junction 26 is connected through a resistance, which in this embodiment is illustrated as a single resistor 27, to common 11. The junction 26 is also connected to a terminal 30 having a positive voltage source connected thereto through a semiconductor junction means, which in this embodiment is illustrated as a semiconductor diode 31 having the anode connected to the junction 26 and the cathode connected to the terminal 30. The diode 31 is a large area PN junction diode which is sensitive to radiation and provides a photocurrent having a rise time approximately equal to the rise time of a dose of radiation applied thereto. It should be understood that substantially any semiconductor diode is sensitive to radiation but increasing the area increases the amount of radiation striking the diode and increases the current through the diode.

The diode 31 is normally biased in a reverse direction by the positive voltage applied to the cathode thereof so that little or no current flows in the circuit. Thus, base current from the base 23 of the transistor 20 flows through the resistor 24 and maintains the transistor 20 in a saturation mode of operation. When radiation, such as gamma rays, strike the diode 31 carriers are injected into the depletion layer and current is allowed to flow in a reverse direction therethrough. This current increases in proportion to the increase of radiation striking the diode 31, as described above, and flows through the capacitor 25 into the resistor 24. The current flowing through the resistor 24 from the diode 31 produces a positive voltage at the base 23 which cuts off conduction of the transistor 20. The transistor 20 is a gold doped, high speed saturated switch which makes the transition from saturation to cut off in nanoseconds.

With the transistor 20 cut off high currents cannot flow through the connection 36 to the protected circuit 10 and energy dissipated in the circuit 10 will be very low. It should be noted that the protected circuit 10 operates in a fashion similar to that described for the diode 31, when subjected to radiation. Thus, if not protected the circuit 10 would allow large currents to flow therethrough from the external circuit 16. However, by interrupting the connection to the external circuit 16 with the cutoff transistor 20 damaging currents do not build up and the protected circuit 10 will not be harmed. It should be understood that the semiconductor junction means is illustrated as diode 31 for simplicity but many other types of semiconductor devices might be utilized by those skilled in the art.

The cathode of a second semiconductor diode 35 is connected to the collector 22 of the transistor 20 and the anode is connected to the common 11. The diode 35 is a diode similar to the diode 31, which conducts current from the collector 22 to the common 11 when it is submitted to radiation. Diode 35 forms a current source to the common 11 from the collector 22 to drain off the charge stored in the saturated collector to base junction of the transistor 20 and, therefore, optionally may be added to increase the speed of cut off of the transistor 20.

Figure 2:
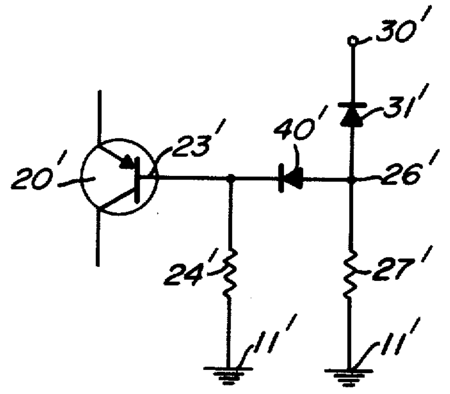
FIG. 2 is a schematic diagram similar to FIG. 1 illustrating a second embodiment of the disconnect means.

Referring to FIG. 2, a circuit similar to FIG. 1 is illustrated, with portions thereof removed, and like parts designated by similar numbers having a prime added to indicate the different embodiment. In this embodiment base 23' of a PNP type transistor 20' is connected through a resistor 24' to common 11'. The base 23' is also connected to the cathode of a diode 40'. The anode of the dioxide 40' is connected to the junction 26' which is connected through a resistor 27' to the common 11' and through a diode 31' to the terminal 30' having a positive source of voltage applied thereto. The diode 40' is utilized in this embodiment instead of the capacitor 25 so that the circuit may be more easily incorporated into an integrated circuit. In all other respects the embodiment of FIG. 2 operates as the described operation of FIG. 1.

Thus, an improved radiation triggered disconnect means is illustrated and described wherein damaging photocurrents are prevented from flowing in a circuit by opening the path of the current. Further, the circuit illustrated, while only representative and opposite conductivity components might be utilized, is relatively simple and inexpensive to construct. Also, the disconnect means can be incorporated into an integrated circuit so that the circuit is automatically hardened to radiation.

While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. Radiation triggered disconnect means for use with a circuit to be protected and a suitable power source for said circuit comprising:

a. a transistor having first, second and control electrodes;
b. means coupling the first and second electrodes of said transistor in a series circuit including the circuit to be protected and the power source for applying power from the power source to the circuit to be protected;
c. bias means connected to the control electrode of said transistor normally biasing said transistor in a saturation mode of operation;
d. semiconductor junction means coupled to a power source in a normally reverse biased orientation and providing a flow of current in response to radiation impinging thereon, said semiconductor junction means being further coupled to the control electrode of said transistor for applying the flow of current to overcome the bias of said bias means and substantially cutoff conduction of said transistor; and
e. second semiconductor junction means coupled in parallel with the circuit to be protected in a normally reverse biased orientation and providing a discharge current path in parallel with the circuit in response to radiation impinging on said second semiconductor junction means.

2. Radiation triggered disconnect means for use with a circuit to be protected and a suitable power source for said circuit comprising:

a. a transistor having first, second and control electrodes;
b. means coupling the first and second electrodes of said transistor in a series circuit including the circuit to be protected and the power source for applying power from the power source to the circuit to be protected;
c. bias means connected to the control electrode of said transistor normally biasing said transistor in a saturation mode of operation; and
d. semiconductor diode means coupled to a power source in a normally reverse biased orientation and providing a flow of current in response to radiation impinging thereon, said semiconductor diode means being further coupled to the control electrode of said transistor for applying the flow of current to overcome the bias of said bias means and substantially cutoff conduction of said transistor.

3. Radiation triggered disconnect means as claimed in claim 2 wherein the transistor is a gold doped, high speed switch.

4. Radiation triggered disconnect means as claimed in claim 2 wherein the transistor is a PNP type with the first electrode an emitter and the second electrode a collector, the power source is a positive voltage source connected to the emitter of said transistor and the circuit to be protected is connected between the collector of said transistor and a common.

5. Radiation triggered disconnect means as claimed in claim 4 wherein the bias means includes a resistance connected between the control electrode of the transistor and the common.

6. Radiation triggered disconnect means as claimed in claim 5 wherein the semiconductor junction means includes a semiconductor junction diode having a cathode connected to a positive voltage source and an anode connected through a resistance to common, the anode of said diode being coupled to the control electrode of the transistor.

7. Radiation triggered disconnect means as claimed in claim 6 wherein the anode of the diode is coupled to the control electrode of the transistor by a capacitor.

8. Radiation triggered disconnect means for use with a circuit to be protected and a suitable positive voltage power source for said circuit comprising:

a. a PNP transistor having an emitter, a collector and a base;

b. means coupling the emitter and collector of said transistor in a series circuit including the circuit to be protected and the power source is connected to said emitter for applying power from the power source to the circuit to be protected which is connected between said collector and a common;

c. bias means connected to the control electrode of said transistor normally biasing said transistor in a saturation mode of operation;

d. semiconductor diode means coupled to a power source in a normally reverse biased orientation and providing a flow of current in response to radiation impinging thereon, said semiconductor diode means being further coupled to the base of said transistor for applying the flow of current to overcome the bias of said bias means and substantially cutoff conduction of said transistor, said semiconductor diode means including an anode; and e. a second semiconductor diode for said further coupling.

9. Radiation triggered disconnect means as claimed in claim 8 including in addition a semiconductor diode sensitive to radiation with the cathode connected to the collector of the transistor and the anode connected to the common.

* * * * *